US008908375B2

(12) United States Patent
Konishide et al.

(10) Patent No.: US 8,908,375 B2
(45) Date of Patent: Dec. 9, 2014

(54) COOLER OF POWER CONVERTING DEVICE FOR RAILROAD VEHICLE

(71) Applicant: Hitachi, Ltd., Chiyoda-ku, Tokyo (JP)

(72) Inventors: Masaomi Konishide, Tsuchiura (JP); Yasuhiko Kono, Hitachinaka (JP); Akihiro Hishida, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 199 days.

(21) Appl. No.: 13/743,370

(22) Filed: Jan. 17, 2013

(65) Prior Publication Data

US 2013/0188315 A1 Jul. 25, 2013

(30) Foreign Application Priority Data

Jan. 20, 2012 (JP) ................. 2012-009734

(51) Int. Cl.
*H05K 7/20* (2006.01)

(52) U.S. Cl.
CPC .......... *H05K 7/20336* (2013.01); *H05K 7/2089* (2013.01); *H05K 7/20936* (2013.01)
USPC ...... 361/704; 361/700; 361/679.54; 361/710; 361/715

(58) Field of Classification Search
USPC ...................... 361/704, 700, 679.54, 710, 715
See application file for complete search history.

(56) References Cited

U.S. PATENT DOCUMENTS 7,808,785 B2 * 10/2010 Meier ........................... 361/704
2012/0050993 A1 * 3/2012 Suzuki et al. ................. 361/700

FOREIGN PATENT DOCUMENTS

JP 2000-200866 7/2000

* cited by examiner

*Primary Examiner* — Andargie M Aychillhum
(74) *Attorney, Agent, or Firm* — Antonelli, Terry, Stout & Kraus, LLP.

(57) ABSTRACT

A cooler of a power converting device for a railroad vehicle has heat exchanger tubes or heat radiator fins disposed to enhance the cooling performance of semiconductor devices arranged on an upper level of the multiple semiconductor devices arranged in multiple rows. Temperature detecting elements are arranged to detect temperature of the semiconductor devices arranged on a lower level on a windward side and a leeward side with respect to a traveling wind performing heat exchange with the heat radiator fins, and are arranged to detect temperature of the semiconductor devices arranged on the upper level at a center area thereof.

4 Claims, 5 Drawing Sheets

US 8,908,375 B2

COOLER OF POWER CONVERTING DEVICE FOR RAILROAD VEHICLE

The present application is based on and claims priority of Japanese patent application No. 2012-009734 filed on Jan. 20, 2012, the entire contents of which are hereby incorporated by reference.

BACKGROUND OF THE INVENTION

1. Field of the Invention

The present invention relates to a power converting device mounted on a railroad vehicle, and especially relates to a cooler for semiconductor devices disposed on the power converting device.

2. Description of the Related Art

A railroad vehicle is designed to travel by converting commercial-frequency AC power or a DC power to a three-phase AC having variable frequency and driving a motor thereby. As a power converter for converting power, a variable voltage variable frequency (VVVF) inverter or the like that uses multiple semiconductor devices such as IGBTs as power semiconductor switching elements and converting DC into three-phase AC having variable frequency is widely used.

IGBT and other semiconductor devices create a large loss during power conversion, so that a dedicated cooler is required. Such cooler has a large number of heat radiator fins for radiating heat, and cooling is performed by sending cooling wind to the heat radiator fins using fans, or by having heat radiator fins exposed on the side surface of the vehicle body and cooling the heat radiator fins via traveling wind flowing on the side surface of the car body during travel.

As described, the cooler adopting a cooling method using air flowing on the side surface of the car body during traveling of the vehicle is called a traveling wind cooler.

In the traveling wind cooler, there is no need to dispose fans and the required cost is low, but since the traveling wind speed varies by vehicle speed, the cooling wind speed is increased when the vehicle speed is increased and the cooling performance is improved, but when the vehicle is at a stop or when the vehicle is travelling at low speed, the cooling wind speed via traveling wind is reduced and the cooling performance is also reduced, and especially when the vehicle is at a stop, the cooling performance is minimized. Therefore, the cooler using traveling wind for cooling must be designed to cool all the semiconductor devices sufficiently even when the vehicle is at a stop.

The cooling wind flown into the cooler when the vehicle is at a stop is generated by the updraft caused by the heat dissipation from the heat radiator fins, wherein the updraft taken in from the lower area of the power converter first cools the semiconductor devices disposed on the lower area, and thereafter cools the semiconductor devices disposed on the upper area before exiting from the upper area of the power converter.

The semiconductor devices disposed on the lower area of the power converter are cooled by the outer air having low temperature taken in from the lower area of the cooler, but the semiconductor devices disposed on the upper area of the power converter is cooled using the updraft heated by the lower semiconductor devices, so that sufficient radiation cannot be performed and the cooling performance is deteriorated as a result. Thus, in general, countermeasures are taken to enhance the radiation performance of the cooler for cooling the semiconductor devices disposed on the upper area of the power converter, such as increasing the number of heat radiator fins or increasing the number of heat exchanger tubes such as heat pipes for transferring heat.

Now, the prior art technique will be described with reference to FIGS. 6 through 10.

FIG. 6 is a perspective view of a traveling wind cooler according to the prior art, FIG. 7 is a side view of FIG. 6, and FIG. 8 is an upper view thereof. FIG. 9 shows a performance curve of the traveling wind cooler according to the prior art.

In FIG. 6, 600 illustrates a heat absorption panel disposed substantially parallel with and perpendicular to a traveling direction of the railroad vehicle, 601 illustrates heat radiator fins arranged substantially in parallel with the heat absorption panel 600, 602 illustrates temperature detecting elements such as thermistors attached to the heat absorption panel 600, 603 illustrates semiconductor devices constituting power converters such as IGBTs disposed to contact one side of the heat absorption panel 600 to enable heat exchange, and 604 illustrates heat exchanger tubes arranged to extend in a substantially perpendicular direction with respect to the heat absorption panel 600 from the other side of the heat absorption panel 600 opposing to the side on which the semiconductor devices 603 are attached. In the illustrated example, semiconductor devices 603 are arranged in three rows along the direction of travel of the railroad vehicle and two levels on each row, an upper level and a lower level, wherein the temperature detecting elements 602 are attached to the heat absorption panel 600 so as to detect the temperature of the semiconductor devices 603 disposed on the upper area of each row.

The heat generated in the semiconductor devices 603 is absorbed by the heat absorption panel 600, and the heat is transferred to the heat exchanger tubes 604, a portion of which is either embedded to or in contact with the heat absorption panel 600. The heat exchanger tubes 604 adopt, for example, a so-called heat pipe system in which a determined amount of liquid coolant such as water is filled in the interior of a pipe and heat is transferred by the change of phase of the coolant.

The heat of the heat exchanger tube 604 is transferred to the heat radiator fins 601 and emitted to the atmosphere, and in general, it is common to dispose multiple heat radiator fins 601 so as to efficiently transfer the heat from the heat exchanger tube 604 to the atmosphere.

Recently, also in the field of railroad vehicles, reduction of weight and size of the various equipment and cutting down of costs are strongly demanded from the viewpoint of saving energy, and therefore, an important problem to be solved in designing the above-described type of traveling wind coolers is to reduce heat radiator fins 601 and heat exchanger tubes 604 to a minimum. As described earlier, there is a problem in the traveling wind cooler that the cooling performance of the cooler for cooling the semiconductor devices disposed on the upper area of the power converter is deteriorated when the vehicle is travelling at a slow speed or is at a stop, so that a configuration is adopted to enhance the cooling of the upper area of the power converter, so that as shown in FIGS. 6 through 8, the number of heat radiator fins 601 or the number of heat exchanger tubes 604 are increased in the upper are of the power converter compared to the numbers thereof in the lower area of the power converter, so as to enhance the cooling performance in that area.

FIG. 9 is a performance diagram illustrating the effect when the cooling of the upper area of the power converter is enhanced, as shown in FIGS. 6 through 8. FIG. 9 illustrates the relationship between the vehicle speed and the cooling performance, and in the drawing, the cooling performance becomes higher as the graph approximates the upper end. The solid line in the drawing shows the cooling performance via the cooler disposed on the lower area of the power converter, the dashed-dotted line shows the cooling performance at the upper area of the power converter when the cooling performance at the upper area of the power converter and the cooling performance at the lower area of the power converter are set to be equivalent, that is, when the number of heat radiator fins 601 and the number of heat exchanger tubes are set uniformly in the upper and lower areas, and the dotted line shows the cooling performance when the cooling performance by the cooler on the upper area of the power converter has been improved by increasing the number of heat radiator fins 601 or the number of heat exchanger tubes 604 disposed on the upper area of the power converter.

In the case where the cooling performance has been set uniformly in the upper and lower areas (dashed-dotted line of FIG. 9), sufficient traveling wind cannot be acquired when the vehicle is traveling at a slow speed or is at a stop, and in addition, the upper level cooler is influenced by the updraft heated by the cooler on the lower level and the cooling performance thereof is deteriorated significantly, but when the vehicle speed is increased, the cooling performance is improved, which tends to saturate near the design maximum speed.

On the other hand, in the case where the number of heat radiator fins disposed on the upper area of the power converter is increased (dotted line of FIG. 9), the overall performance is improved and especially the cooling performance when the vehicle is at a stop or traveling at a low speed is improved significantly approximating the performance of the lower level cooler, wherein as the vehicle speed increases, the cooling performance is also increased, and at the design maximum speed, the cooling performance at the lower level is designed to be saturated so that the cooling performance of the upper level becomes equivalent to the cooling performance of the lower level. Based on such design, it is known that the number of heat radiator fins, the number of heat exchanger tubes and the volume of the cooler can be minimized, and costs can be cut down.

Regarding such cooler, in order to prevent damage caused by abnormal overheat of semiconductor devices 603, as shown in FIG. 6, temperature detecting elements 602 are attached to a windward side, a center area and a leeward side of the upper level cooler that has a constantly lower cooling performance than the lower level cooler and thus having a high possibility of reaching the maximum temperature.

For example, patent document 1 shown below discloses such structure.

Patent Document 1: Japanese Patent Application Laid-Open Publication No. 2000-200866

However, the above-described cooler has the following problems.

As described earlier, in a traveling wind cooler, the cooling performed to the upper area of the power converter when the vehicle is at a stop or is traveling at low speed is enhanced, and at the design maximum speed, the cooling performance is designed to be equal at the upper and lower areas of the power converter.

This technique has no drawback in a power converter designed so that the predetermined speed equals the design maximum speed of the vehicle, but especially in recent years, there are demands to increase the maximum speed without increasing vehicle costs, that is, without having to perform a significant design change, so that vehicles must be designed to travel at higher speed without changing the basic specifications of the traveling wind cooler, such as the arrangement of semiconductor devices, the heat radiator fins and the heat exchanger tubes.

Further, even if the railroad vehicle is traveling at a speed below the design maximum speed, if the railroad vehicle receives headwind, the speed of the cooling wind received by the traveling wind cooler is relatively equivalent to the traveling wind speed when the vehicle travels at a speed higher than the design maximum speed.

In such case, it has been discovered that as the vehicle exceeds the design maximum speed, the cooling performance at the lower area of the power converter becomes lower than the cooling performance at the upper area thereof.

For example, as shown in FIG. 10, if a certain additional speed is added by increasing the design maximum speed or via headwind, the wind speed of the cooling wind relatively becomes higher than the design maximum speed, so that the cooling performance of the cooler on the upper level of the power converter having an increased number of heat radiator fins is increased even through the cooling performance of the cooler on the lower level of the power converter is saturated, so that the lines of performance of the cooler at the upper level of the power converter and the cooler at the lower level thereof cross near the design maximum speed, and as the added speed increases, the cooling performance of the cooler on the lower level falls below the cooling performance of the cooler on the upper level.

It is presumed that such phenomenon is caused by the cooling of the lower level being originally designed to have a low cooling performance compared to the cooler on the upper level, and the speed of the cooling wind relatively exceeding the design vehicle maximum speed, so that the updraft heated by the semiconductor devices disposed on the lower level flows along the cooling wind without reaching the cooler disposed on the upper area by the high-speed cooling wind.

This phenomenon is especially noticeable in the cooler disposed on the leeward side on the lower level being influenced by the heat radiation from the semiconductor devices disposed on the upstream side of the cooling wind.

If the vehicle continues to travel in such circumstances, the semiconductor devices disposed on the leeward side on the lower level is most likely to cause overheat compared to other semiconductor devices, but if the thermistors are disposed only on the upper level of the power converter as in the prior art, it will not be possible to detect abnormality of semiconductor devices disposed on the leeward side on the lower level of the power converter. Further, if thermistors are disposed on all the semiconductor devices on the upper level and the lower level of the power converter to prevent the above problem, another problem is caused in that the device becomes complex by the increased number of wires for connecting thermistors, and the costs thereof are increased.

The present invention solves this problem by providing a cooler capable of detecting abnormalities stably in vehicles regardless of whether the vehicle is at a stop or traveling at maximum speed, without having to change the basic design even if the design maximum speed is increased or if influences from the outer environment such as headwind are received.

SUMMARY OF THE INVENTION

In order to realize the above-mentioned object, the present invention provides a cooler of a power converting device for a railroad vehicle having the following characteristics. That is, the present invention provides (1) A cooler of a power converting device for a railroad vehicle comprising a heat absorption panel disposed perpendicularly and substantially in parallel with a direction of travel of the railroad vehicle; a plurality of semiconductor devices disposed to contact one side of the heat absorption panel and arranged in multiple rows along the direction of travel of the railroad vehicle and in multiple levels in a vertical direction; a heat exchanger tube having a portion thereof embedded to or in contact with the other side of the heat absorption panel so as to oppose to the side on which the semiconductor devices are disposed, and arranged substantially perpendicular to the heat absorption panel; a plurality of heat radiator fins in contact with another area of the heat exchanger tube and arranged substantially in parallel with the heat absorption panel; and a plurality of temperature detecting elements arranged on the one side of the heat absorption panel for detecting temperature of the semiconductor devices; wherein the heat exchanger tube or the heat radiator fins are arranged so as to enhance a cooling performance of the semiconductor devices disposed on an upper level in said multiple rows of semiconductor devices, and the multiple temperature detecting elements are arranged so as to detect the temperature of semiconductor devices arranged on the lower level on a windward side and a leeward side with respect to a traveling wind performing heat exchange with the heat radiator fin, and to detect the temperature of semiconductor devices arranged on the upper level at a center area thereof.
(2) Further according to the above-described cooler of a power converting device for a railroad vehicle, on a middle level, the multiple temperature detecting elements are arranged at a position lower than the temperature detecting elements disposed on an upper level at the center area and higher than the temperature detecting elements disposed on a lower level at the leeward side and the windward side.
(3) Further according to the above-described cooler of a power converting device for a railroad vehicle, the semiconductor device is an IGBT.
(4) Further according to the above-described cooler of a power converting device for a railroad vehicle, the temperature detecting element is a thermistor.

According to the present invention, it becomes possible to reliably detect the temperature of semiconductor devices having a highest possibility of causing overheat without having to add temperature detecting elements, even when the design maximum speed of the vehicle is increased or when unexpected environmental influences such as headwind is received, without having to change the specification of the cooler or the like. Therefore, a cooler of a power converting device for a railroad vehicle having high safety can be realized without causing increase of costs.

DETAILED DESCRIPTION OF THE PREFERRED EMBODIMENTS

Now, the preferred embodiments of the present invention will be described with reference to the drawings.

Embodiment 1

Figure 1:
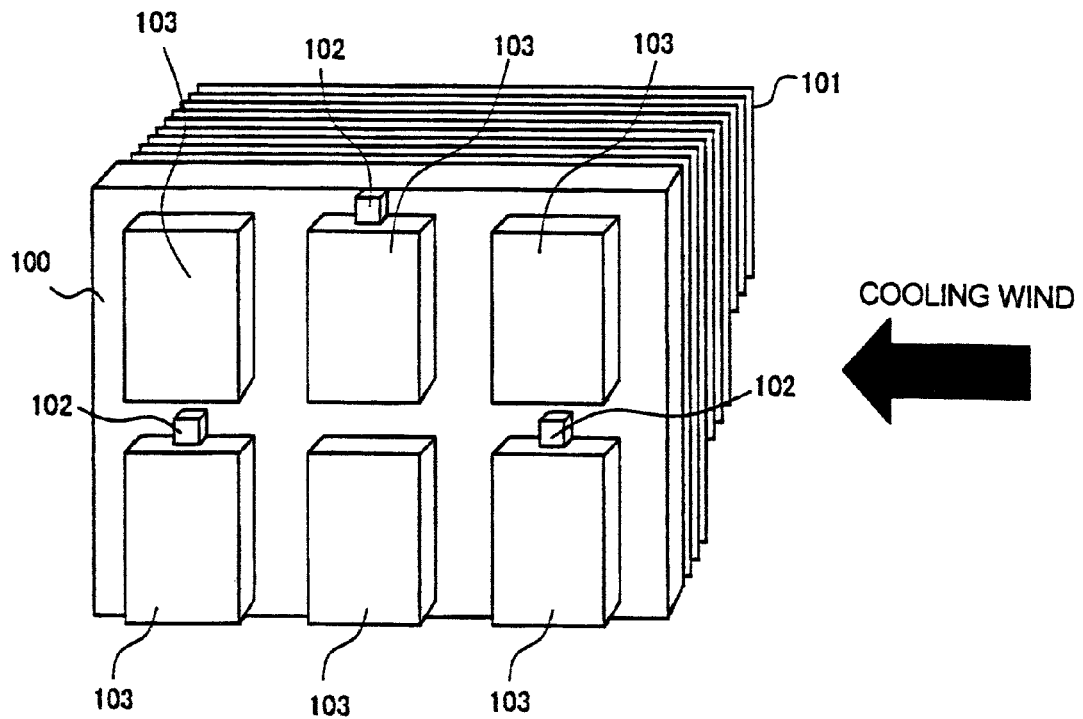
FIG. 1 is a bird's eye view according to embodiment 1 of the present invention.
Figure 2:
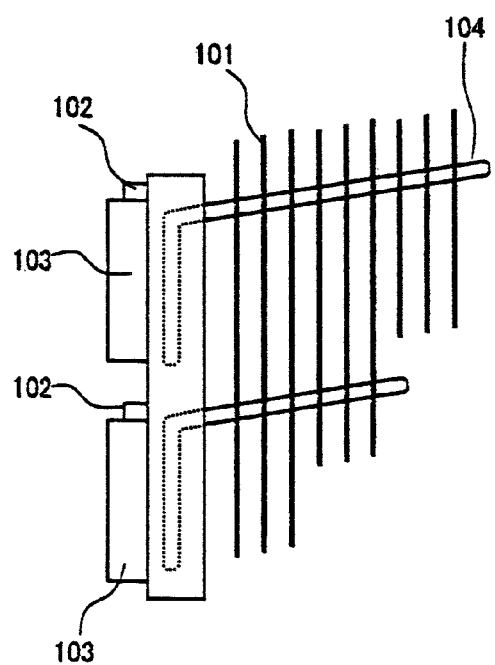
FIG. 2 is a side view showing a structure of embodiment 1 according to the present invention.
Figure 3:
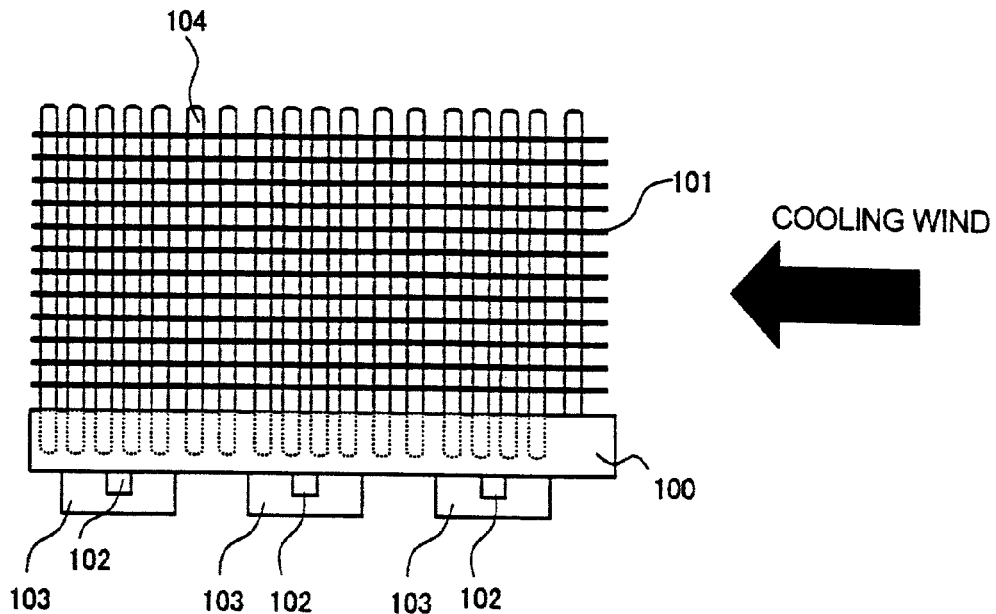
FIG. 3 is an upper view showing a structure of the embodiment according to the present invention.
Figure 4:
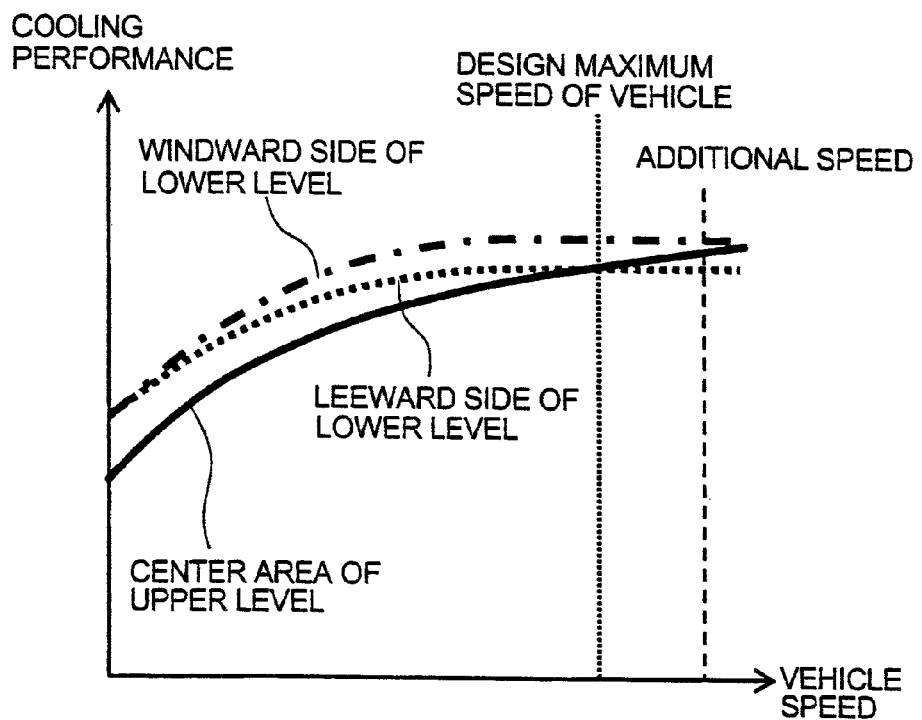
FIG. 4 shows a cooling performance curve according to embodiment 1 of the present invention.
Figure 6:
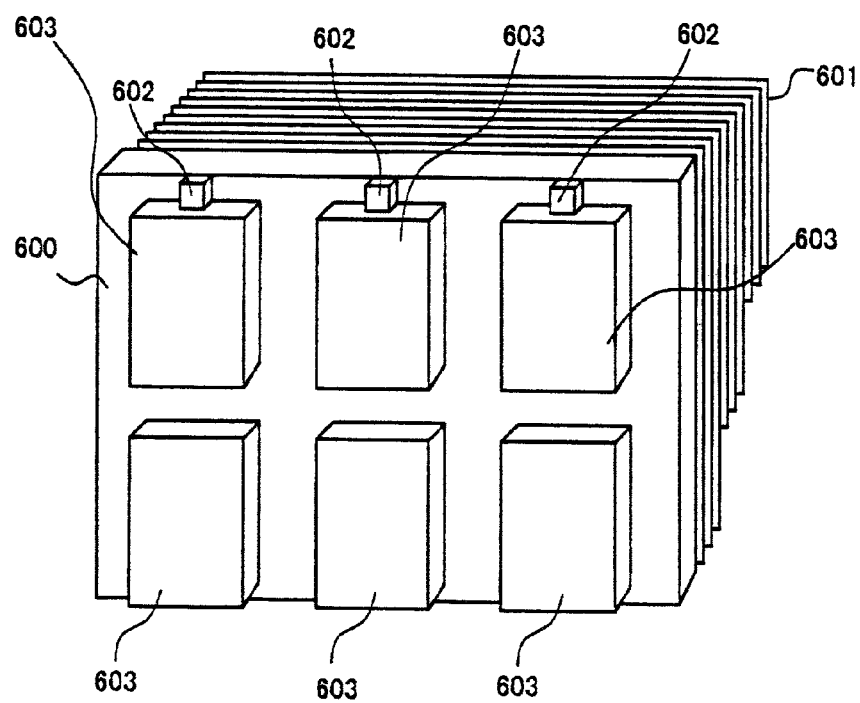
FIG. 6 is a bird's eye view according to the prior art.
Figure 7:
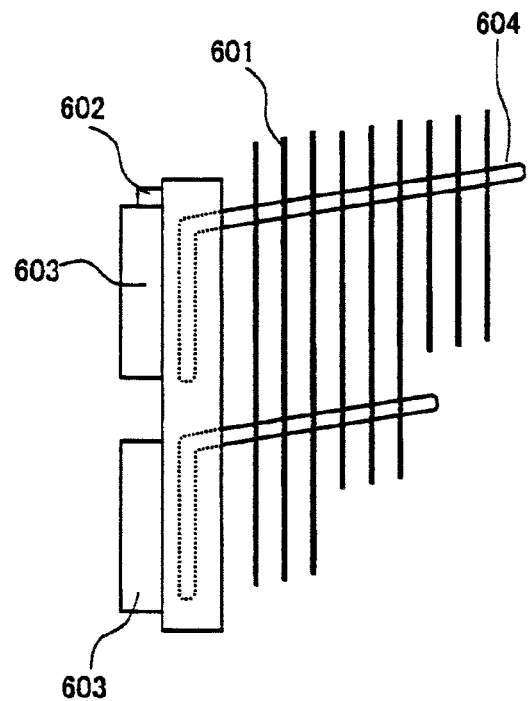
FIG. 7 is a side view showing a structure of the prior art.
Figure 8:
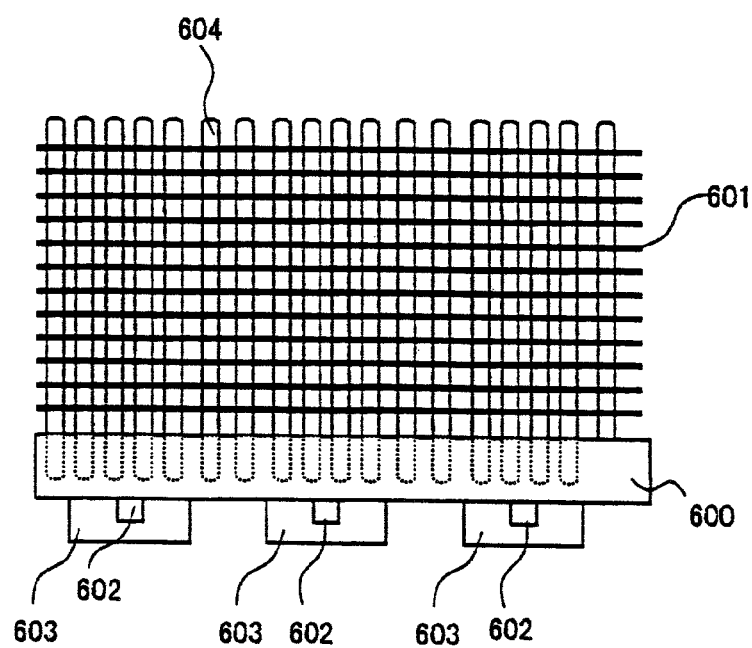
FIG. 8 is an upper view showing a structure of the prior art.
Figure 9:
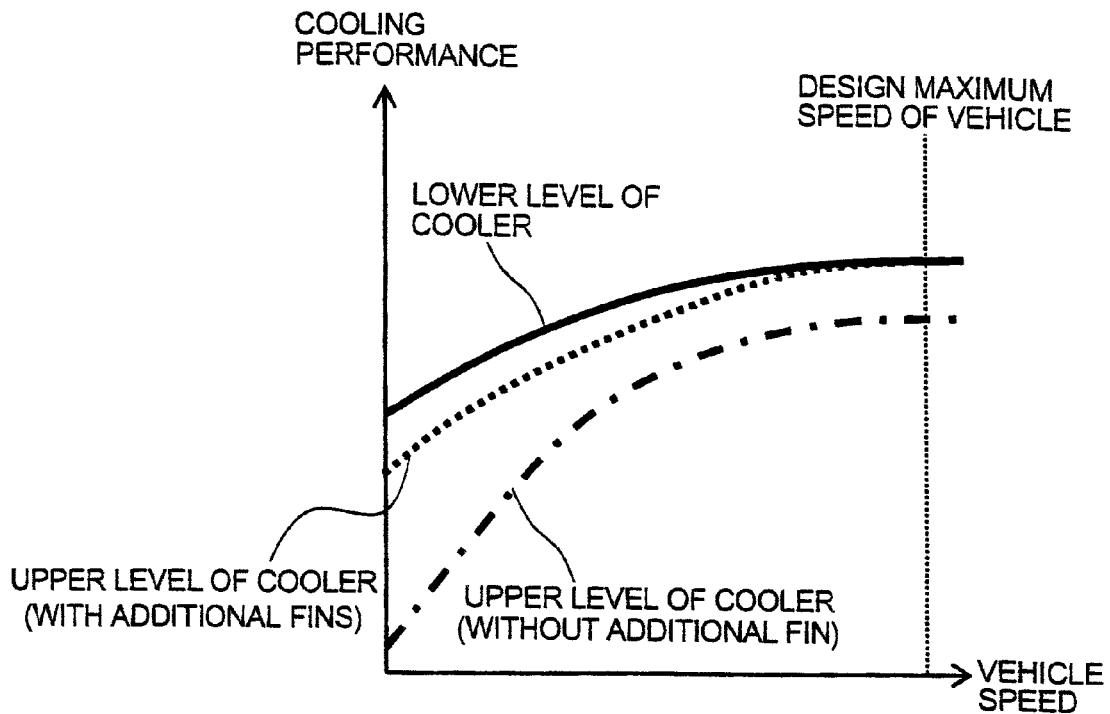
FIG. 9 is a cooling performance curve (design maximum speed and lower) according to the prior art.
Figure 10:
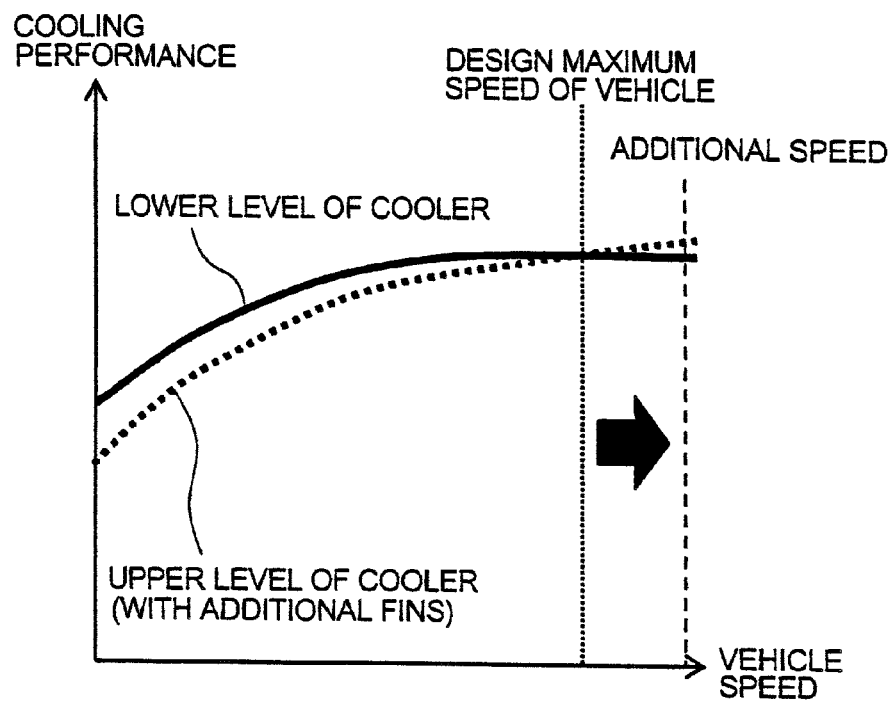
FIG. 10 is a cooling performance curve (including a case where the design maximum speed is exceeded) according to the prior art.

FIG. 1 is a bird's eye view showing a cooler of a power converting device for a railroad vehicle according to embodiment 1 of the present invention, FIG. 2 is a side view of FIG. 1, and FIG. 3 is an upper view of FIG. 1.
In FIGS. 1 through 3, 100 denotes a heat absorption panel, 101 denotes heat radiator fins, 102 denotes temperature detecting elements, 103 denotes semiconductor devices, and 104 denotes a heat exchanger tube, adopting a basic configuration similar to the prior art power converting device illustrated in FIGS. 6 through 8 except for the allocation of the temperature detecting element.
The characteristic feature of the present embodiment is that the temperature detecting elements 102 are arranged on a lower level at a windward side and a leeward side with respect to a cooling wind in the direction of the arrow in FIG. 1, that is, with respect to a traveling wind, and arranged on an upper level at a center area thereof.
In FIG. 4, the solid line shows the characteristics of the cooling performance at the center area on the upper level of the power converter, the dotted line shows the characteristics of the cooling performance at the leeward side on the lower level, and the dashed-dotted line shows the characteristics of the cooling performance at the windward side on the lower level.
Since the cooler disposed on the center area on the upper level has other coolers surrounding itself on the windward side, the leeward side and the lower side, so that it has a deteriorated cooling performance compared to the coolers arranged not only on the windward side on the upper level but also on the leeward side on the upper level, and its cooling performance is deteriorated most compared to the coolers arranged on other areas during the period of time when a vehicle reaches its design maximum speed from a stopped state. Therefore, regarding the upper level area of the power converter, a temperature of the semiconductor device having the highest possibility of causing overheat may be detected without fail by disposing a temperature detecting element 102 only at the center area.
On the other hand, if an additional amount of speed is added to the design maximum speed, it can be seen from FIG. 4 that the cooling performance of the cooler at the leeward side on the lower level falls below the cooling performance of the cooler disposed at the center area on the upper level, by which the possibility of overheat becomes maximum.
That is, as for the cooler disposed on the lower level, the cooling performance is set low from the beginning compared to the cooler disposed on the upper level, and in this speed zone, the heat emitted from the cooler disposed on the windward side is carried via traveling wind and strongly influences the cooler disposed on the leeward side.
Therefore, regarding the windward side and the leeward side of the power converter, the temperature of the semiconductor device having the highest possibility of causing overheat may be detected without fail by disposing the temperature detecting element 102 on the lower level.

Generally, in many cases, a railroad vehicle is operated via shuttle operation or the like where the direction of travel of the train is reversed, so that if the temperature detecting element is disposed only on one side, that side may become a windward side during shuttle operation, according to which desired effects cannot be achieved. Therefore, as for the lower level of the power converter, it is necessary to arrange the temperature detecting elements so as to enable detection of temperature of the semiconductor device on both left and right ends. Also in that case, the number of temperature detecting elements 102 to be disposed can be the same as in the prior art illustrated in FIG. 6.

According to the configuration of the present embodiment, it becomes possible to detect without fail the semiconductor device temperature having the highest possibility of causing overheat from when the vehicle is at a stopped state to when the vehicle reaches a high speed zone exceeding the design maximum speed, without changing any specification of the cooler, and without increasing the number of thermistors even when the design maximum speed is increased or when the external conditions such as the headwind is changed to fall out of the intended design range.

Embodiment 2

Figure 5:
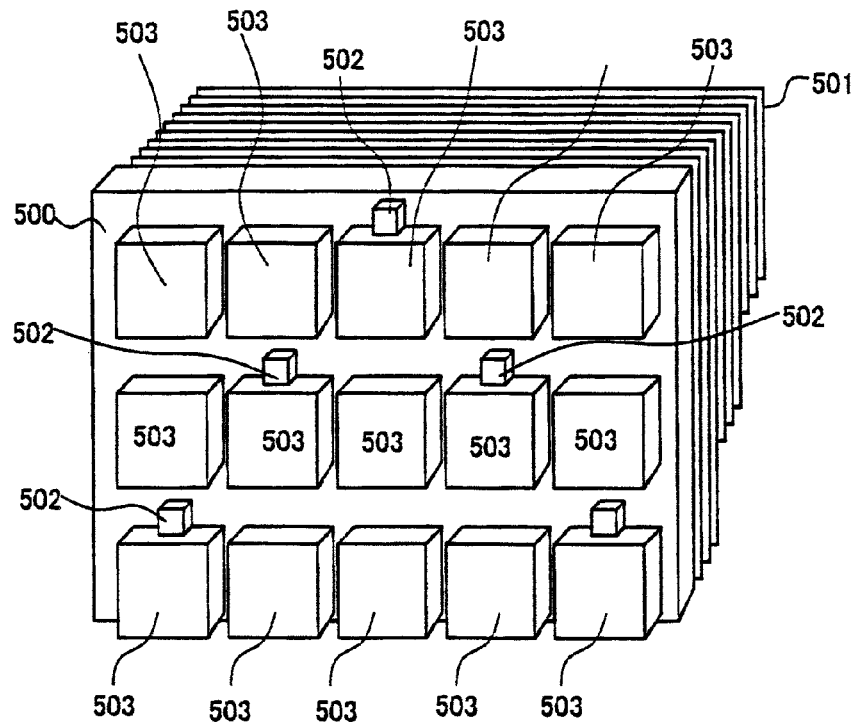
FIG. 5 is a bird's eye view according to embodiment 2 of the present invention.

FIG. 5 illustrates the overall configuration of embodiment 2 according to the present invention.

In FIG. 5, reference number 500 denotes a heat absorption panel, 501 denotes heat radiator fins, 502 denotes temperature detecting elements, and 503 denotes semiconductor devices.

The characteristic feature of the present embodiment is that when there are three or more levels of semiconductor devices arranged in the vertical direction, the temperature detecting elements 502 are disposed not only at the left and right ends on the lower area but also in the center area.

The power converter illustrated in FIG. 5 shows an example in which semiconductor devices 503 are arranged in three levels in the vertical direction and five or more rows in the direction of travel of the railroad vehicle.

According to the illustrated configuration, in a section from where the vehicle travels at low speed to where the vehicle reaches its maximum speed, the center level has four sides, which are the upper, lower, left and right sides, surrounded by other coolers except for the coolers on the leeward side end and the windward side end, so that when additional speed is added to the design maximum speed, the performance of the cooler disposed near the center area on the middle level is most deteriorated. Therefore, according to the present embodiment, the temperature detecting elements 502 are attached near the center area for the semiconductor devices 503 disposed at the middle level of the power converter, so as to enable the temperature of the semiconductor devices having the highest possibility of causing overheat to be detected without fail.

REFERENCES

100: heat absorption panel, 101: heat radiator fin, 102: temperature detecting element, 103: semiconductor device, 104: heat exchanger tube, 500: heat absorption panel, 501: heat radiator fin, 502: temperature detecting element, 503: semiconductor device, 600: heat absorption panel, 601: heat radiator fin, 602: temperature detecting element, 603: semiconductor device, 604: heat exchanger tube.

What is claimed is:

1. A cooler of a power converting device for a railroad vehicle comprising:
   a heat absorption panel disposed perpendicularly and substantially in parallel with a direction of travel of the railroad vehicle;
   a plurality of semiconductor devices disposed to contact one side of the heat absorption panel and arranged in multiple rows along the direction of travel of the railroad vehicle and in multiple levels in a vertical direction;
   a heat exchanger tube having a portion thereof embedded to or in contact with the other side of the heat absorption panel so as to oppose to the side on which the semiconductor devices are disposed, and arranged substantially perpendicular to the heat absorption panel;
   a plurality of heat radiator fins in contact with another area of the heat exchanger tube and arranged substantially in parallel with the heat absorption panel; and
   a plurality of temperature detecting elements arranged on the one side of the heat absorption panel for detecting temperature of the semiconductor devices;
   wherein the heat exchanger tube or the heat radiator fins are arranged so as to enhance a cooling performance of the semiconductor devices disposed on an upper level in said multiple rows of semiconductor devices, and the multiple temperature detecting elements are arranged so as to detect the temperature of semiconductor devices arranged on the lower level on a windward side and a leeward side with respect to a traveling wind performing heat exchange with the heat radiator fin, and to detect the temperature of semiconductor devices arranged on the upper level at a center area thereof.

2. The cooler of a power converting device for a railroad vehicle according to claim 1, wherein
   on a middle level, the multiple temperature detecting elements are arranged at a position lower than the temperature detecting elements disposed on an upper level at the center area and higher than the temperature detecting elements disposed on a lower level at the leeward side and the windward side.

3. The cooler of a power converting device for a railroad vehicle according to claim 2, wherein
   the semiconductor device is an IGBT.

4. The cooler of a power converting device for a railroad vehicle according to claim 3, wherein
   the temperature detecting element is a thermistor.

* * * * *